United States Patent
Jang et al.

(10) Patent No.: US 7,122,415 B2
(45) Date of Patent: Oct. 17, 2006

(54) ATOMIC LAYER DEPOSITION OF INTERPOLY OXIDES IN A NON-VOLATILE MEMORY DEVICE

(75) Inventors: Chuck Jang, Fremont, CA (US); Zhong Dong, Sunnyvale, CA (US); Vei-Han Chan, San Jose, CA (US); Ching-Hwa Chen, Milpitas, CA (US)

(73) Assignee: ProMOS Technologies, Inc., Hsin-Chu (TW)

( * ) Notice: Subject to any disclaimer, the term of this patent is extended or adjusted under 35 U.S.C. 154(b) by 0 days.

(21) Appl. No.: 10/243,379

(22) Filed: Sep. 12, 2002

(65) Prior Publication Data

US 2004/0051134 A1   Mar. 18, 2004

(51) Int. Cl.
   *H01L 21/8238*   (2006.01)
(52) U.S. Cl. ............ 438/201; 438/211; 438/216; 438/264; 438/785
(58) Field of Classification Search ........... 257/314, 257/315, 324; 438/201, 211, 257, 261, 264, 438/216, 785
See application file for complete search history.

(56) References Cited

U.S. PATENT DOCUMENTS

| 4,613,956 | A | | 9/1986 | Paterson et al. |
| 6,054,393 | A | * | 4/2000 | Niccoli ............... 438/745 |
| 6,063,666 | A | * | 5/2000 | Chang et al. ........ 438/261 |
| 6,074,954 | A | | 6/2000 | Lill et al. |
| 6,274,902 | B1 | | 8/2001 | Kauffman et al. |
| 6,300,203 | B1 | | 10/2001 | Buynoski et al. |
| 6,319,775 | B1 | * | 11/2001 | Halliyal et al. ........ 438/261 |
| 6,355,524 | B1 | | 3/2002 | Tuan et al. |
| 6,376,888 | B1 | * | 4/2002 | Tsunashima et al. .... 257/407 |
| 6,420,279 | B1 | | 7/2002 | Ono et al. ........... 438/785 |
| 6,524,940 | B1 | * | 2/2003 | Verhaverbeke et al. ... 438/600 |
| 6,576,053 | B1 | * | 6/2003 | Kim et al. ............ 117/89 |
| 6,638,879 | B1 | | 10/2003 | Hsieh et al. |
| 2002/0182820 | A1 | * | 12/2002 | Choi et al. .......... 438/396 |
| 2003/0030099 | A1 | * | 2/2003 | Hsieh et al. ......... 257/315 |
| 2003/0049942 | A1 | * | 3/2003 | Haukka et al. ....... 438/778 |

OTHER PUBLICATIONS

Brown, William D. & Brewer, Joe E. "Nonvolatile Semiconductor Memory Technology: A Comprehensive Guide to Understanding and Using NVSM Devices" pp. 10-25; The Institute of Electrical and Electronics Engineers, Inc., New York.

* cited by examiner

*Primary Examiner*—Hoai Pham
(74) *Attorney, Agent, or Firm*—MacPherson Kwok Chen & Heid LLP

(57) ABSTRACT

Aluminum oxide is deposited by atomic layer deposition to form a high-k dielectric for the interpoly dielectric layer of a non-volatile memory device. The increased capacitive coupling can allow a thicker oxide layer to be used between the floating gate and the control gate, resulting in improved reliability and longer lifetime of the memory cells fabricated according to this invention.

18 Claims, 3 Drawing Sheets

ATOMIC LAYER DEPOSITION OF INTERPOLY OXIDES IN A NON-VOLATILE MEMORY DEVICE

BACKGROUND OF THE INVENTION

The present invention relates to integrated circuits, and more particularly to nonvolatile integrated memories.

FIG. 1 shows a cross section of a stacked gate nonvolatile memory cell such as used in flash and non-flash electrically erasable programmable read only memories (EEPROM). Conductive floating gate 110, made of doped polysilicon, overlies monocrystalline silicon substrate 120. Silicon dioxide 130 insulates the floating gate from the substrate. N type source/drain regions 140 in substrate 120 are separated by type channel region 150. Channel region 150 is directly below the floating gate. Dielectric 160 separates the floating gate from control gate 170 made of doped polysilicon.

The memory cell is read by applying a voltage between the regions 140, applying a voltage between one of the regions 140 and control gate 170, and detecting a current through the other one of the regions 140. The memory cell is written (programmed or erased) by modifying a charge on floating gate 110. Floating gate 110 is completely insulated on all sides. To modify the charge on the floating gate, electrons are transferred between the floating gate and substrate 150 through oxide 130. The electrons can be transferred by Fowler-Nordheim tunneling or hot electron injection. See "Nonvolatile Semiconductor Memory Technology" (1998) edited by W. D. Brown and J. E. Brewer, pages 10–25, incorporated herein by reference. The electron transfer requires a voltage to be established between the floating gate and a substrate region (the substrate region can be channel 150 or a source/drain region 140). This voltage is established by creating a voltage between the substrate region and the control gate. The control gate voltage is coupled to the floating gate. To reduce the voltage required to be created between the substrate region and the control gate, a high capacitive coupling is needed between the floating and control gates. A high specific capacitance (capacitance per unit area) can be obtained between the floating and control gates by reducing the thickness of dielectric layer 160. However, dielectric layer 160 functions as a barrier to a charge leakage from the floating gate to the control gate. Therefore, dielectric 160 has to be a high quality, thin, uniform dielectric in order to provide good data retention (low leakage) and ensure a predictable high capacitive coupling between the floating and control gates.

Dielectric 160 can be silicon dioxide as shown in FIG. 1. However, as the dimensions of the devices continues to shrink, the thickness of the $SiO_2$ layer must also decrease to maintain the same capacitance between the floating gate and the control gate. Thicknesses of less than 2 nm are expected in the future. However, the occurrence of high tunneling current through such thin layers of $SiO_2$ requires that alternative materials be considered. ONO (silicon dioxide, silicon nitride, silicon dioxide) has been used as dielectric layer 160. See U.S. Pat. No. 4,613,956 issued Sep. 23, 1986 to peterson et al. The nitride layer has a higher dielectric constant than silicon dioxide, thus increasing the capacitive coupling between the floating gate and the control gate. The higher capacitive coupling allows a thicker layer to be used to reduce leakage current without diminishing the capacitive coupling. Another option is a combination of silicon dioxide and oxynitride layers for dielectric layer 160. Thus, according to U.S. Pat. No. 6,274,902, a silicon dioxide layer is thermally grown on floating gate polysilicon, and an oxynitride layer is deposited by LPCVD (low pressure chemical vapor deposition) on the silicon dioxide.

SUMMARY

This section summarizes some features of the invention. The invention is defined by the appended claims that are incorporated into this section by reference.

In some embodiments of the present invention, the silicon nitride layer of the ONO is substituted with a high-k dielectric layer formed by a deposition technique known as atomic layer deposition (ALD).("High-k" refers to materials having a dielectric constant greater than about 4). Using ALD, single monolayers of the high-k material can be formed at a time, resulting in a nearly perfect crystal structure with fewer crystal defects or pin holes. Reducing the number of defects reduces the number of defect states, which allow undesired electron transport across the oxide barrier. Therefore the leakage current is minimized, while the dielectric constant remains higher than that of silicon dioxide by a factor of 2–6 times. Aspects of the invention include the method for forming the atomic monolayers, and their inclusion in an interpoly stack of a flash memory cell.

In a first embodiment of the invention, the middle layer of silicon nitride in a conventional ONO interpoly stack is substituted with a high-k dielectric film deposited using an ALD process. After the ALD process, a second layer of silicon dioxide can be deposited on the surface of the high-k layer, using the usual high temperature oxide (HTO) techniques.

Optionally, other dielectric layers (e.g. silicon nitride, oxynitride) can be formed on the thermally grown silicon dioxide layer.

In some embodiments, dielectric 160 can include only layers made with ALD, rather than a multi-layer stack of HTO/high-k oxide/HTO.

The invention is applicable to split gate memories and other flash and non-flash floating gate memories, known or to be invented. Other features of the invention are described below. The invention is defined by the appended claims.

DETAILED DESCRIPTION

Figure 2:
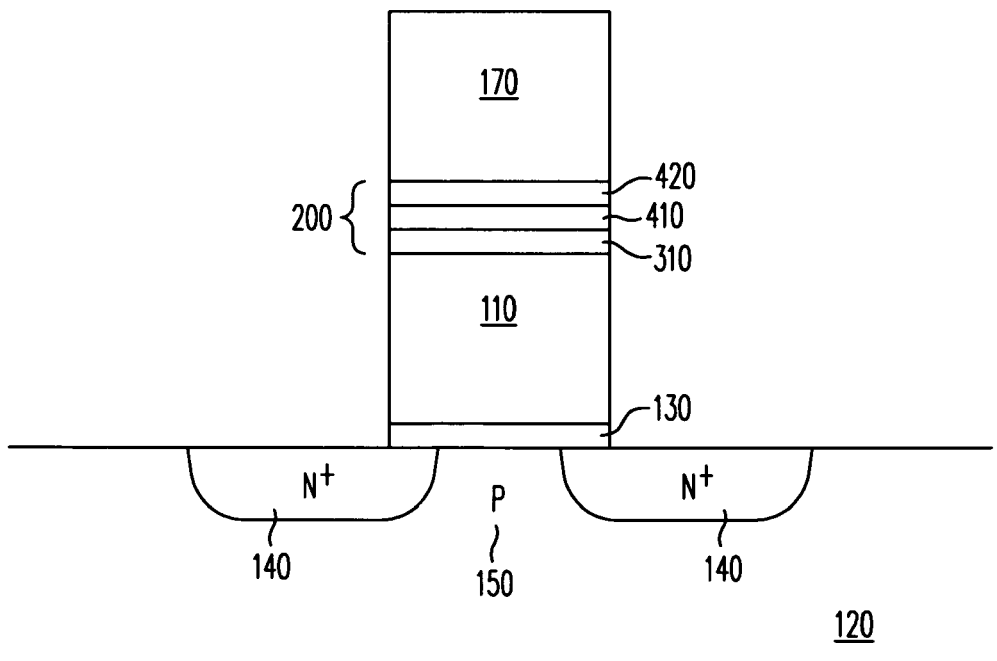
FIGS. 2, 4 and 5 show cross sections of nonvolatile memory cells during a process of fabrication according to some embodiments of the present invention.

FIG. 2 illustrates a cross section of a nonvolatile memory cell at an intermediate stage of fabrication. In the illustrative embodiment being described, substrate 120 is a suitably doped (e.g. P-doped) monocrystalline silicon substrate; appropriate wells (not shown) have been formed in the substrate, as described in U.S. Pat. No. 6,355,524 entitled "Nonvolatile Memory Structures and Fabrication Methods", filed Aug. 15, 2000 by H. T. Tuan et al., incorporated herein by reference. Other types of substrates, including non-silicon substrates, can also be used. The invention is not limited by any particular wells or doping types.

Source/drain regions 140 are formed by doping. Additional layers (not shown) may be formed to provide select gates, erase gates, or other features. See the aforementioned U.S. Pat. No. 6,355,524 B1 for an exemplary memory fabrication process that can be modified to incorporate the atomic-layer deposition oxide described above.

Semiconductor substrate 120 (monocrystalline silicon or some other material) is processed to form a suitably doped channel region 150 (type p in FIG. 2, but an N type channel can also be used). Dielectric 130 is formed on substrate 120 over channel 150. Dielectric 130 may be thermally grown silicon dioxide or some other type of dielectric, and is known as "tunnel oxide" because the memory cell can be erased by the Fowler-Nordheim tunneling of electrons from the floating gate to substrate 120. In some embodiments, the oxide is grown at around 800 C-900 C, by dry oxidation to a thickness of 8–10 nm. The invention is not limited to Fowler-Nordheim tunneling or silicon dioxide.

Then polysilicon layer 110 is deposited on top of the tunnel oxide and doped during or after deposition. The polysilicon layer can be fabricated using, for example, a POLYGON chamber manufactured by Applied Materials, Inc. of Santa Clara, Calif. The polysilicon layer may be 1200A–1800A thick, deposited by low pressure chemical vapor deposition (LPCVD), and doped with phosphorus to a concentration of 1E19–1E20 atoms/cm$^3$. The dopant may be applied via a gas mixture comprising $SiH_4/PH_3$ at 610 C, at 250–300 Torr, or by ion implantation.

polysilicon layer 110 will provide the floating gates and, possibly, other circuit elements as needed for the peripheral circuitry. Such elements may include interconnects, transistor gates, resistors and capacitor plates.

In a first embodiment, shown in FIG. 2, a trilayer interpoly dielectric layer is formed upon the polysilicon layer 110. The trilayer interpoly dielectric 200 may be preferably a three layer structure, as denoted by reference numerals 310, 410, and 420 in FIG. 2. For example, layers 310, 410, and 420 may be silicon oxide, a high-k dielectric material, and silicon oxide respectively. Layer 200 may have a total thickness from about 13 nm to 160 nm. This structure is often called the interpoly dielectric since it is sandwiched between the phosphorous doped polysilicon layer 110 constituting the floating gate for a flash memory cell, and a second polysilicon layer 170 that forms the control gate for the cell. The first and third layers 310 and 420 of the interpoly dielectric are the silicon dioxide layers which may be formed as a High Temperature Oxide (HTO). The middle layers 410 of the interpoly dielectric are the high-k materials formed by sequential ALD of single monolayers of one or more high-k materials, for example, aluminum oxide, to form a continuous high-k film.

A number of high-k materials are of interest in forming the dielectric layers (e.g. layer 410) for thin capacitors. Table I below compares some dielectric materials with high-k materials which can be formed using atomic layer deposition.

TABLE I

| Material | Dielectric Constant | Energy Gap (eV) |
| --- | --- | --- |
| $SiO_2$ | 3.9 | 9.0 |
| $Si_3N_4$ | 7.0 | 5.0 |
| $Al_2O_3$ | 8.0 | 7.0 |
| $HfO_2$ | 20–25 | 5.7 |
| $ZrO_2$ | 20–25 | 5.2 |
| $TaO_2$ | 60–80 | 3.2 |
| $TiO_2$ | 23–26 | 4.2 |

According to Table I, aluminum oxide is among the most desirable materials because of its combination of a high energy gap for low leakage current, and a high dielectric constant for high capacitive coupling. The dielectric layer 410 formed by the ALD method of the present embodiment has a high dielectric constant, a low defect density, and fewer interface traps than for example CVD films, and so the reliability of the interpoly dielectric layer can be increased in flash memory cells. It is consequently possible to prevent charge leakage from the floating gate to the control gate and facilitate Fowler-Nordheim tunneling, thereby enhancing the erase operation. The increased coupling ratio leads to reduced applied voltage requirements, which, in turn, leads to longer life of the flash memory cells made in accordance with this invention.

Because of the desirable properties of aluminum oxide, the remainder of this specification will deal primarily with this material as the high-k dielectric material to be deposited by ALD. However it is clear that the techniques disclosed herein may be applied to other high-k dielectric materials (e.g. those listed in Table I) that can be deposited using ALD.

In the first embodiment of FIG. 2, a first layer of silicon oxide 310 (FIG. 2) is formed as a high temperature oxide in a low pressure chemical vapor deposition (LPCVD) process on the top surface of polysilicon layer 110. The silicon oxide may be used to minimize or prevent subsequent processing, such as the deposition of the aluminum oxide, from deleteriously effecting the first polysilicon layer. In particular, the silicon oxide layer has a thickness suitable to minimize or prevent oxidation of the first polysilicon layer during formation of the aluminum oxide high-k layers. In this embodiment, the silicon oxide layer 310 may have a thickness of about 5 nm, or in the range of 3 to 8 nm. The silicon oxide layer 310 can be obtained at 750° C. by reacting dichlorosilane $SiH_2Cl_2$ in an $N_2O$ atmosphere at 300–500 mTorr. Other thicknesses, processes, and process parameters may also be used.

The second layer of the trilayer structure of the interpoly dielectric 200 is the high-k film formed by ALD. The ALD process is outlined by the flow chart in FIG. 3. The ALD process may include, as a preliminary step, the preparation of the wafer surface by cleaning. In one embodiment, the cleaning solution may be a mixture of $NH_4OH$, $H_2O_2$ and deionized water, that is warmed to 45–55 C. The cleaning solution is followed by a hydrofluoric rinse, and then followed by another mixed chemical cleaning in a solution of HCl, $H_2O_2$ and deionized water. The wafer is left with a hydroxy-terminated surface structure Si—O—H on the top of layer 310.

The high-k, e.g. aluminum oxide, layer 410 is next formed over the cleaned HTO surface by introducing an aluminum tri-methyl precursor gas alternating with water vapor, into the reaction chamber. Genus, Inc. of Sunnyvale, Calif. manufactures an ALD tool that can be used in connection with the process described herein. Although the process described herein is well suited to solving the problem of depositing $Al_2O_3$ on hydroxy-terminated silicon surfaces, it is entirely possible to use this process to deposit aluminum oxide on other surfaces including silicon dioxide, silicon oxynitride, silicon germanium, and on silicates.

Figure 3:
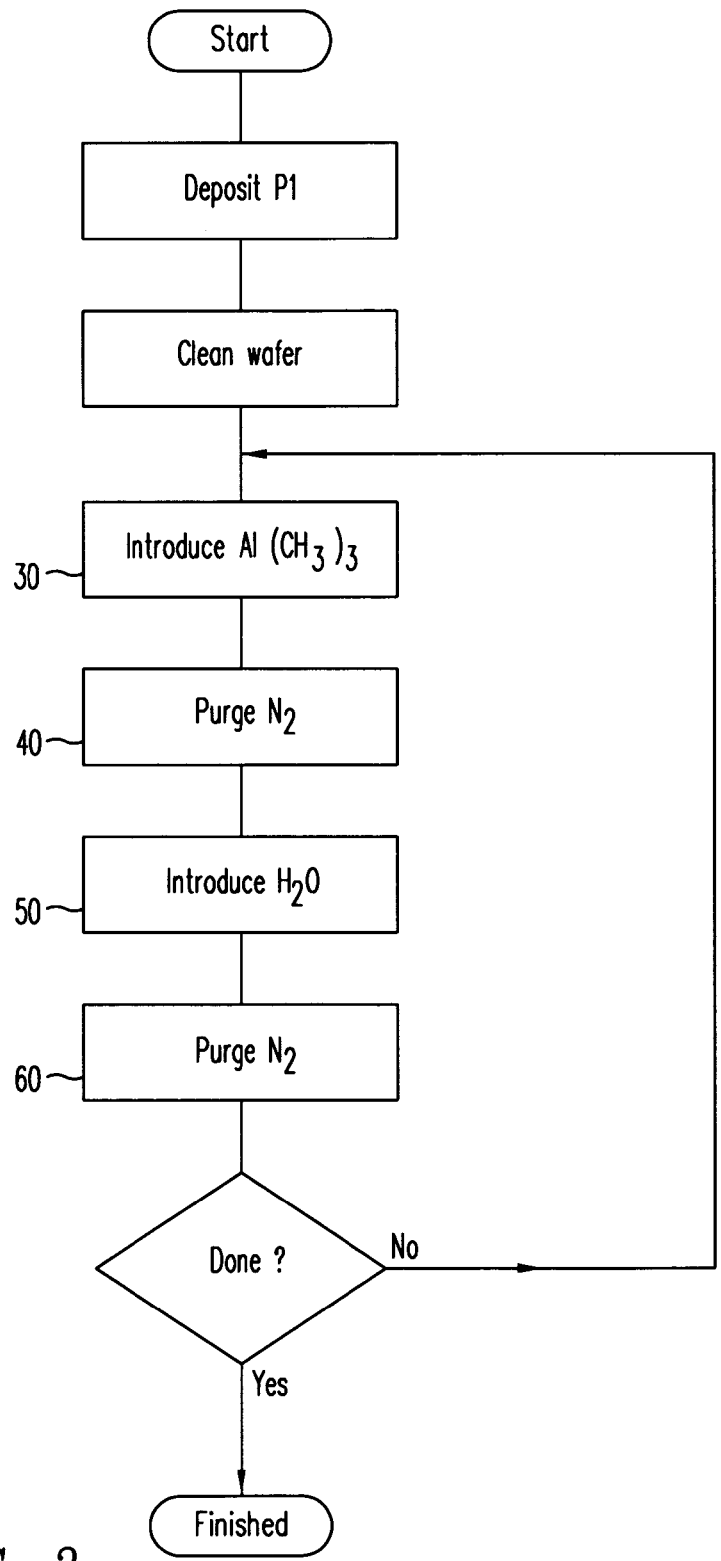
FIG. 3 is a flow chart of a process in accordance with the invention.

As described in the flow chart of FIG. 3, for a first embodiment of the invention, a first step 30, is to introduce a $Al(CH_3)_3$ precursor gas into a Genus LYNX Series Model ALD Chamber containing a pre-cleaned substrate at a temperature of 200–400C. The $Al(CH_3)_3$ precursor gas is at a pressure of 10–100 Torr, and chemisorbs onto the surface of the silicon oxide layer 310 until the surface is saturated with Al atoms. As a second step 40, the chamber is then purged with an inert gas such as nitrogen, helium, or argon to remove any excess or residual aluminum tri-methyl or undesirable reactants. Next, in a third step 50, an oxidizing gas is introduced, such as water vapor or ozone. The water vapor oxidizes the Al chemisorbed onto the substrate surface, until the surface is saturated with a monolayer of aluminum oxide. Saturation of the surface typically occurs within milliseconds of exposure to the activating gases. Lastly, in a fourth step 60, the chamber is purged with an inert gas, such as argon or nitrogen, to reduce or eliminate the oxidizing gas and any undesired reactants. By repeating the steps 30 through 60, a high-k thin film can be deposited, a single monolayer at a time.

The ALD process is inherently growth rate limited by the number of cycles of alternate exposure to the aluminum tri-methyl compound, and the oxidizing gas, with appropriate purging. For this embodiment the total thickness of the high-k dielectric layer 410 is about 8 mm, or in the range of 5 to 13 nm. The high-k film in this example is amorphous aluminum oxide, with a better atom-to-atom arrangement than may be obtained with other deposition methods, for example, chemical vapor deposition (CVD). The film is stoichiometric, i.e. $Al_2O_3$ rather than $Al_2$-$xO_3$, and should have no dangling bonds at the interface surface.

A second silicon oxide layer 420 may be formed on top of the high-k dielectric layer 410, as, for instance, a high temperature oxide by the LPCVD method. As described previously, such an oxide deposition can be performed at 750° C. by reacting dichlorosilane $SiH_2Cl_2$ in an $N_2O$ atmosphere at 300–500 mTorr. An exemplary thickness of layer 420 is 4 nm. Other thicknesses, processes, and process parameters may also be used.

Therefore, in one embodiment the overall thickness of dielectric layer 410, including silicon oxide layer 310, a high-k ALD aluminum oxide layer 410, and a silicon oxide layer 420 in a stack is 5+8+4 nm=17 nm in one embodiment.

Other high-k materials can be fabricated using the ALD process described above, and substituted as layer 410 for the aluminum oxide in the above example. For example other embodiments are shown in Table II below, which use mostly tetra-chloride precursors and water vapor to form the monolayers of the respective oxides. Continuous monolayer films may be formed by sequential introduction of the following precursor gases, followed by water vapor, under the following conditions, in the reactor mentioned above.

TABLE II

| High-k material | Precursor | Chamber Temperature | Chamber Pressure |
| --- | --- | --- | --- |
| $Al_2O_3$ | $Al(CH_3)_3$, $H_2O$ | 200–400 C. | 10–100 Torr |
| $HfO_2$ | $HfCl_4$, $H_2O$ | 200–350 C. | 10–100 Torr |
| $ZrO_2$ | $ZrCl_4$, $H_2O$ | 200–350 C. | 10–100 Torr |
| $TaO_2$ | $TaCl_5$, $H_2O$ | 250–300 C. | 10–100 Torr |
| $TiO_2$ | $TiCl_4$, $H_2O$ | 200–400 C. | 10–100 Torr |

An annealing process can be included after deposition of the high-k material, if it is found that the film has less leakage or a higher breakdown voltage with such an extra anneal. For example, a Rapid Thermal Anneal (RTA) process may be performed after the deposition to anneal the high-k film. The process parameters for the RTA process may include a temperature of 950–960 C, and a pressure of 1 to 500 Torr of Ar for 30 seconds.

Known techniques can be used to complete the memory fabrication. Doped polysilicon 170, or some other conductive material, is deposited to provide the control gates and possibly wordlines, each of which provides the control gates for a row of memory cells. The stack of layers 170, 420, 410, 310, 110, 130 are patterned as needed, using an etch process.

For instance, the stack of layers including the high-k dielectric layer can be patterned by applying a photoresist mask to the polysilicon/interpoly dielectric stack. Such a mask protects the areas underneath the mask and exposes the unwanted areas to an etchant. A $Cl_2$/HBr chemistry plasma etch will etch the top polysilicon layer. The underlying high-k layers may be etched using 6 mTorr chamber pressure and 500 top source power /–100 V back bias voltage. The etchant gases include chlorine $Cl_2$, flowing at 50 SCCM (standard cubic centimeters per minute), and argon Ar, flowing at 100 SCCM at a pressure of 8 Torr back-side pressure. Lastly, the bottom polysilicon layer is etched using a $Cl_2$/HBr chemistry plasma etch. The aluminum oxide and top and bottom polysilicon are etched through the mask openings to form strips extending in the bitline direction through the memory array.

Figure 4:
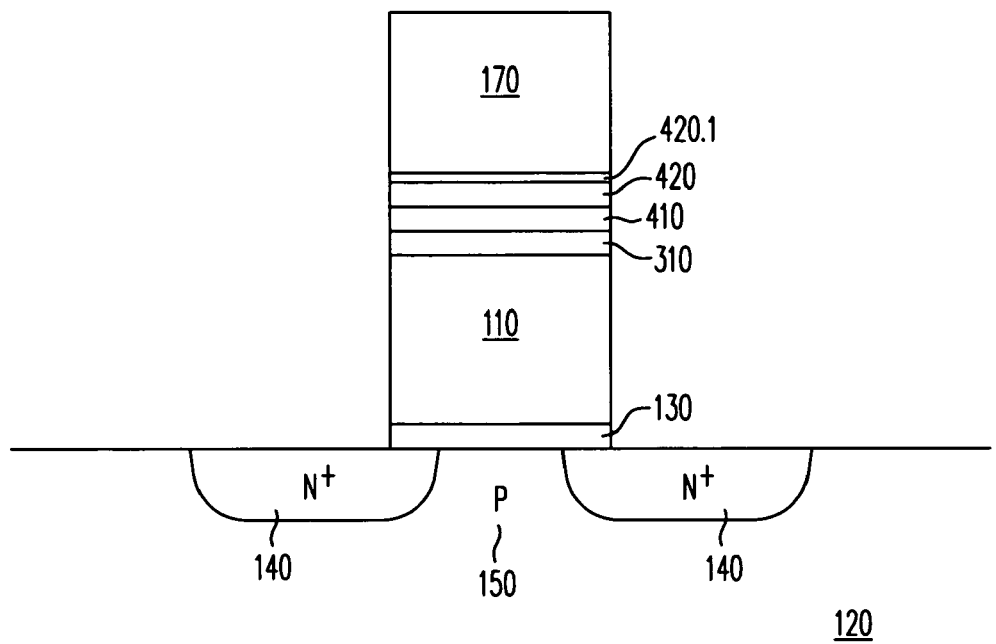

In another embodiment, the top surface of oxide 420 may be nitrided, as shown in FIG. 4, to further improve the data retention. The capacitance is also increased as nitrogen binds with silicon to form silicon nitride. The nitridation can be performed, for example, by ion implantation, Remote plasma Nitridation (RpN) or Decoupled plasma Nitridation (DpN), using the processes described in U.S. Pat. No. 6,074,954 issued on Jun. 13, 2000 to Lill et al. and incorporated herein by reference. A thermal anneal can be performed at the end of the nitridation as described above for layer 110.

In some embodiments, the surface concentration of nitrogen atoms is about 1E20 atom/$cm^3$, and the thickness of the nitrided layer 420.1 at the top of layer 420 is below 1 nm, as shown in FIG. 4.

Figure 5:
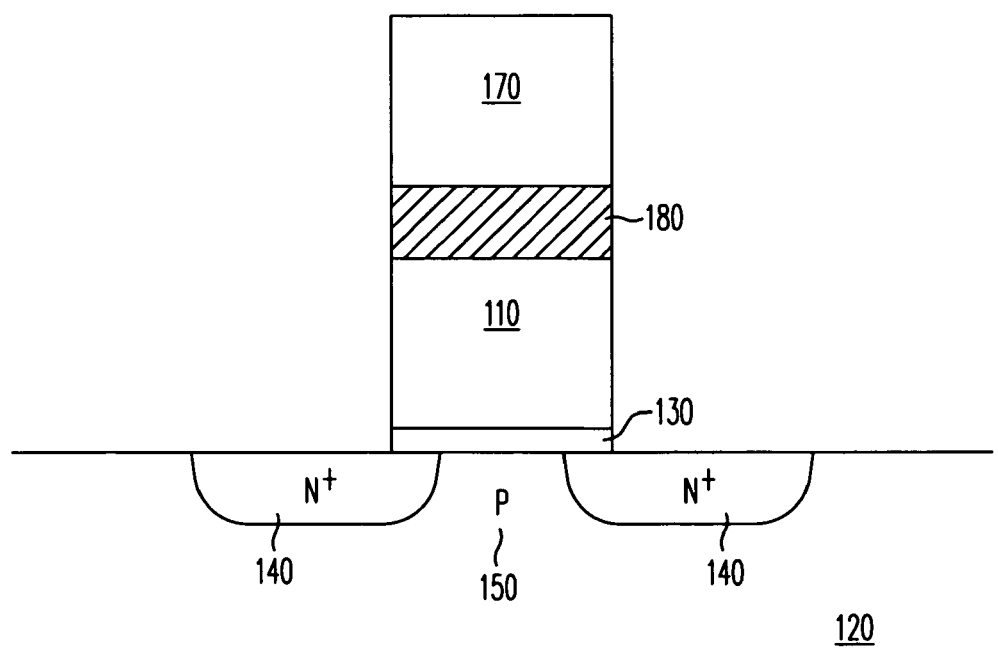

In an alternative embodiment, the silicon oxide layers 310 and 420 of FIG. 2 are omitted in favor of a continuous film of high-k ALD monolayers between the floating gate polysilicon layer 110 and the control gate polysilicon layer 170 of FIG. 2. In FIG. 5, such a continuous high-k film 180 is formed directly on polysilicon layer 110 using atomic layer deposition. The high-k layer may be aluminum oxide, as described above, by repeating the steps 30 through 60, to achieve a total (physical) film thickness of approximately 10–20 nm. The final film thickness may be adjusted in order to meet the original ONO electrical performance requirements. However it is noted that an electrical equivalent oxide thickness can be obtained with a dielectric layer which is twice the thickness of the silicon dioxide film it replaces, because of the increase in the dielectric constant. Therefore, the leakage current in such an embodiment may be expected to be far reduced, compared to the prior art oxide films. Of course, the other high-k dielectric films listed in Table II also may be deposited by ALD and used in place of the aluminum oxide.

In some embodiments, the use of high-k atomic layer deposited interpoly films may not lead to a significant change in the total physical thickness of dielectric 160. However, the specific capacitance between the floating and control gates increases by a factor of two in some embodiments depending on the deposition conditions. Other capacitance parameters can also be obtained. The increased capacitance can enhance the write/erase performance of the memory cell at a given voltage applied to the control gate, resulting in improved lifetime and reliability of the memory device.

Conductive layer 170 (FIG. 2), for example, doped polysilicon, is formed on the ALD-deposited surface of aluminum oxide layer 180 as described above in connection with FIG. 2. This layer will provide the control gate. The structure is patterned and the fabrication is completed as described above in connection with FIG. 2.

The films 170, 420, 410, 310, and 110 in FIG. 2 may be annealed during the activation of the polysilicon doping, or optionally, an additional anneal process can be inserted here (after ALD step), if it is found that the device has a higher breakdown voltage or less leakage current with the inclusion of such an anneal. The process is the same as was described for the rapid thermal anneal of the two high temperature oxide layers 310 and 420 of the ONO stack as shown in FIG. 2. The process parameters for the RTA are 950–960 C at a pressure of 1 to 500 Torr of Ar for 30 seconds.

Figure 1:
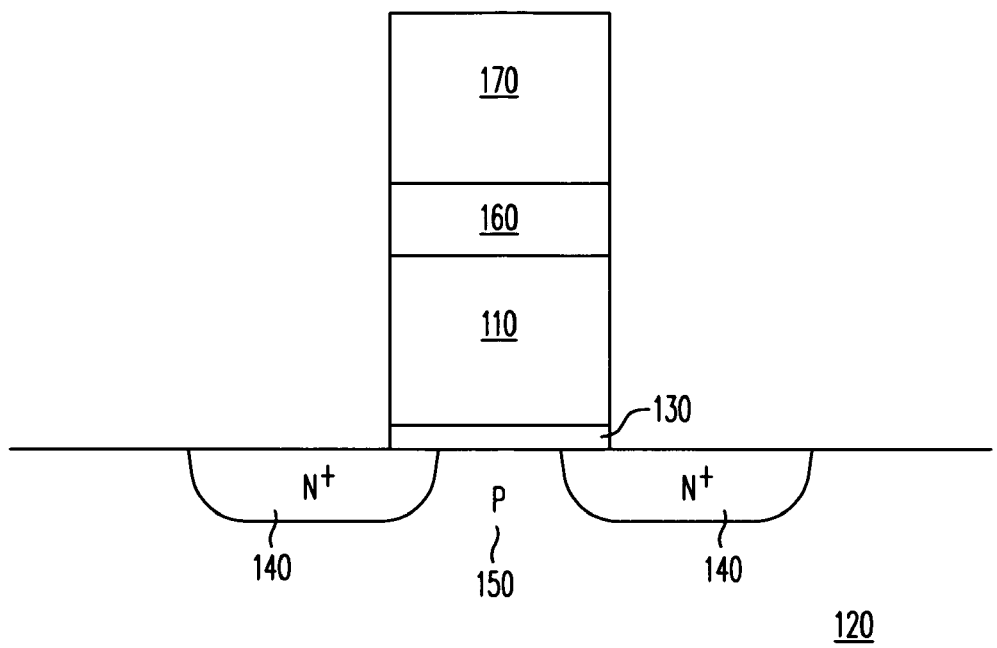
FIG. 1 shows a cross section of a prior art nonvolatile memory cell.

The memory cells of FIGS. 2, 4, and 5 can be operated like the memory cell of FIG. 1. The memory can be programmed by Fowler-Nordheim tunneling of electrons from channel 150 or source/drain region 140 to floating gate 110. The memory can be erased by Fowler-Nordheim tunneling of electrons from the floating gate to channel 150 or a source/drain region 140. In other embodiments, the memory is programmed by hot electron injection, and erased by Fowler-Nordheim tunneling. In still other embodiments, the memory is erased by tunneling of electrons from the floating gate to a separate erase gate (not shown). Other memory structures, including split gate structures with select gates, and other programming and erase mechanisms, known or to be invented, can also be used.

The invention is not limited to the embodiments described above. For instance, the invention is not limited to the particular atomic layer deposition techniques or process parameters, layer thicknesses, or other details. Likewise, the invention is not limited to the particular shape of the floating and control gates or their positioning relative to each other, and the invention is not limited to particular materials. For example, polysilicon 110 can be replaced with amorphous silicon, monocrystalline silicon, or their combinations. Silicon dioxide ($SiO_2$) can be replaced, or mixed with, silicon monoxide (we use the term "silicon oxide" to refer both to silicon dioxide and silicon monoxide). Other embodiments and variations within the scope of the invention, as defined by the appended claims, will occur to practitioners in view of the disclosure herein.

The invention claimed is:

1. A method for manufacturing an integrated circuit comprising a nonvolatile memory, the method comprising:
   forming a first conductive layer, the first conductive layer being to provide one or more floating gates for the nonvolatile memory;
   forming a multilayered dielectric layer over the first conductive layer;
   forming a second conductive layer separated from the first conductive layer by the multilayered dielectric layer, the conductive layer providing one or more control gates for the nonvolatile memory;
   wherein said forming of the multilayered dielectric layer includes:
   (a) forming a second dielectric layer composed of a silicon oxide insulator and having a corresponding upper surface;
   (b) modifying said upper surface of the second dielectric layer so as to form a hydroxy-terminated surface structure (Si—O—H) on the top of said upper surface;
   (c) chemisorbing to said hydroxy-terminated surface structure of the upper surface, a metal-containing and chlorine-containing precursor, where an oxide of said metal defines a high dielectric constant material whose respective dielectric constant is greater than a dielectric constant associated with said second dielectric layer;
   (d) purging away excess amounts of the metal-and-chlorine-containing precursor from the proximity of the surface to which said immediately previous chemisorbing was applied so as to thereby leave behind a monolayer of said precursor;
   (e) oxidizing the left behind monolayer of said step (d) so as to thereby produce a corresponding stoichiometric monolayer of said metal oxide adhered to the surface to which said immediately previous chemisorbing was applied;
   (f) chemisorbing to the monolayer of said metal oxide produced in step (e) more of said metal-containing and chlorine-containing precursor; and
   (g) repeating steps (d) through (f) a predefined number of times so as to produce a desired thickness of said metal oxide defining said high-k dielectric layer adhered to said second dielectric layer.

2. The method of claim 1, further comprising patterning the first conductive layer, the multilayered dielectric layer, and the second conductive layer by lithographic processes after forming said second conductive layer.

3. The method of claim 1, wherein the high-k dielectric layer has a dielectric constant greater than 7.5.

4. The method of claim 1, further comprising
   forming a second silicon oxide layer over the high-k dielectric layer; and
   nitriding the second silicon oxide layer.

5. A method of forming a multi-layered dielectric stack having major layers of respective different compositions, the method comprising:
   (a) forming a first dielectric layer composed of a silicon oxide insulator and having a corresponding first upper surface as well as a corresponding first dielectric constant;
   (b) modifying said first upper surface of the first dielectric layer so as to form a hydroxy-terminated surface structure (Si—O—H) on the top of said first upper surface;
   (c) chemisorbing to said hydroxy-terminated surface structure of the first upper surface, a metal-containing and chlorine-containing precursor, where an oxide of said metal defines a high dielectric constant material whose respective dielectric constant is greater than said first dielectric constant;
   (d) purging away excess amounts of the metal-and-chlorine-containing precursor from the proximity of the surface to which said immediately previous chemisorbing was applied so as to thereby leave behind a monolayer of said precursor;
   (e) oxidizing the left behind monolayer of said step (d) so as to thereby produce a corresponding stoichiometric monolayer of said metal oxide adhered to the surface to which said immediately previous chemisorbing was applied;
   (f) chemisorbing to the monolayer of said metal oxide produced in step (e) more of said metal-containing and chlorine-containing precursor; and
   (g) repeating steps (d) through (f) a predefined number of times so as to produce a desired thickness of said metal oxide defining a second dielectric layer adhered to said first dielectric layer.

6. A method according to claim 5 and further used for manufacturing an integrated circuit comprising a nonvolatile memory, the method further comprising:

(h) forming a first conductive layer below said first dielectric layer, the first conductive layer being to provide one or more floating gates for the nonvolatile memory; and (i) forming a second conductive layer separated from the first conductive layer by at least the first and second dielectric layers, the second conductive layer providing one or more control gates for the nonvolatile memory.

7. The method of claim 5 wherein said step (b) of modifying the first upper surface of the first dielectric layer includes:

(b.1) cleaning the first upper surface with a solution of a mixture of $NH_4OH$, $H_2O_2$ and deionized water.

8. The method of claim 7 wherein during said cleaning, the solution is at 45–55° C.

9. The method of claim 7 wherein said step (b) of modifying the first upper surface of the first dielectric layer includes:

(b.2) further cleaning the first upper surface with a solution of HCl, $H_2O_2$ and deionized water.

10. The method of claim 9 wherein said step (b.2) is performed after said step (b.1).

11. The method of claim 10 wherein said step (b) of modifying the first upper surface of the first dielectric layer includes:

(b.3) between said steps (b.1) and (b.2), further cleaning the first upper surface with a hydrofluoric rinse.

12. The method of claim 5 wherein said step (b) of modifying the first upper surface of the first dielectric layer includes:

(b.1) cleaning the first upper surface with a solution of HCl, $H_2O_2$ and deionized water.

13. The method of claim 5 wherein the second dielectric layer comprises one or more of $HfO_2$, $ZrO_2$, $TaO_2$, and $TiO_2$.

14. The method of claim 5 wherein the precursor comprises one or more of $HfCl_4$, $ZrCl_4$, $TaCl_5$, and $TiCl_4$.

15. The method of claim 5 wherein the precursor comprises $HfCl_4$, and the second dielectric comprises $HfO_2$.

16. The method of claim 5 wherein the precursor comprises $ZrCl_4$, and the second dielectric comprises $ZrO_2$.

17. The method of claim 5 wherein the precursor comprises $TaCl_5$, and the second dielectric comprises $TaO_2$.

18. The method of claim 5 wherein the precursor comprises $TiCl_4$, and the second dielectric comprises $TiO_2$.

* * * * *

UNITED STATES PATENT AND TRADEMARK OFFICE
CERTIFICATE OF CORRECTION

| | |
|---|---|
| PATENT NO. | : 7,122,415 B2 |
| APPLICATION NO. | : 10/243379 |
| DATED | : October 17, 2006 |
| INVENTOR(S) | : Chuck Jang et al. |

Page 1 of 1

It is certified that error appears in the above-identified patent and that said Letters Patent is hereby corrected as shown below:

Col. 1, line 16, insert --P-- before "type".

Col. 1, line 59, delete "peterson" and insert --Peterson--.

Col. 3, line 26, capitalize "polysilicon".

Signed and Sealed this

Seventh Day of October, 2008

JON W. DUDAS
*Director of the United States Patent and Trademark Office*